US006180510B1

(12) United States Patent
Hayashi

(10) Patent No.: US 6,180,510 B1
(45) Date of Patent: Jan. 30, 2001

(54) METHOD OF MANUFACTURING A SUBSTANTIALLY FLAT SURFACE OF A SEMICONDUCTOR DEVICE THROUGH A POLISHING OPERATION

(75) Inventor: Yoshihiro Hayashi, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/104,392

(22) Filed: Jun. 25, 1998

Related U.S. Application Data

(62) Division of application No. 08/773,995, filed on Dec. 26, 1996, now Pat. No. 5,880,003, which is a continuation of application No. 08/157,282, filed on Nov. 26, 1993, now abandoned.

(30) Foreign Application Priority Data

Nov. 27, 1992 (JP) ................................... 4-318904

(51) Int. Cl.⁷ .................... H01L 21/4763; H01L 21/302; H01L 21/461

(52) U.S. Cl. .......................... 438/626; 438/692; 438/698

(58) Field of Search .................................. 438/633, 692, 438/693, 697, 698

(56) References Cited

U.S. PATENT DOCUMENTS

| | | |
|---|---|---|
| 4,614,563 | 9/1986 | Kubo . |
| 4,671,851 | 6/1987 | Beyer et al. . |
| 4,962,064 | 10/1990 | Haskell et al. . |
| 5,246,884 | 9/1993 | Jaso et al. . |
| 5,290,396 | 3/1994 | Schoenborn et al. . |
| 5,298,110 | 3/1994 | Schoenborn et al. . |
| 5,344,797 | 9/1994 | Pai et al. . |
| 5,356,513 | 10/1994 | Burke et al. . |
| 5,395,801 | 3/1995 | Doan et al. . |
| 5,399,533 | 3/1995 | Pramanika et al. . |

FOREIGN PATENT DOCUMENTS

| | | |
|---|---|---|
| 1-209727 | 8/1989 | (JP) . |
| 3-295239 | 12/1991 | (JP) . |
| 5-315308 | 11/1993 | (JP) . |

OTHER PUBLICATIONS

Stanley Wolf, Ph.D., "Silicon Processing For The VLSI Era," *Bipolar and BICMOS Process Integration*, vol. 2: Process Integration, Lattice Press (1990), cover page and pp. 486–491.

W. Kern et al., "Borophosphosilicate Glasses For Integrated Circuits," *Solid State Technology*, Jun. 1985, pp. 171–179.

Japanese Article published in *Nikkei Microdevices*, Jun. 1988, pp. 33–46.

R.R. Uttecht et al., "A Four–Level–Metal Fully Planarized Interconnect Technology For Dense High Performance Logic and SRAM Applications," VMIC Confernece, Jun. 11–12, 1991, pp. 20–26.

Primary Examiner—Charles Bowers
Assistant Examiner—Erik J Kielin
(74) Attorney, Agent, or Firm—Burns, Doane, Swecker & Mathis, LLP

(57) ABSTRACT

For giving a device surface to a semiconductor device comprising a semiconductor substrate portion which has a substrate surface and a protruding portion protruding from the substrate surface, a method includes the steps of coating the substrate surface and the protruding portion with a first anti-polishing film, depositing an insulator film on the first anti-polishing film, and coating the insulator film with a second anti-polishing film. The insulator film has a first polishing rate for a polishing operation. The second anti-polishing film has a second polishing rate which can be slower than the first polishing rate for the polishing operation. Thereafter, the polishing operation is applied to the second anti-polishing film and to the insulator to make the device surface become substantially planarized. It is preferable that the first anti-polishing film has the second polishing rate for the polishing operation.

3 Claims, 10 Drawing Sheets

METHOD OF MANUFACTURING A SUBSTANTIALLY FLAT SURFACE OF A SEMICONDUCTOR DEVICE THROUGH A POLISHING OPERATION

This application is a divisional, of application Ser. No. 08/773,995, filed Dec. 26, 1996; now U.S. Pat. No. 5,880,003 which is a continuation of application Ser. No. 08/157,282, filed Nov. 26, 1993, now abandoned.

BACKGROUND OF THE INVENTION

This invention relates to a method of providing a semiconductor device with a substantially planarized device surface through a polishing operation.

Generally, a semiconductor device is made of a silicon substrate and comprises a semiconductor substrate portion having a substrate surface. It is assumed that the semiconductor device further comprises a plurality of protruding portions protruding from the substrate surface. The protruding portions may be an Al wiring pattern.

The semiconductor device has a device surface in question and may comprise an integrated circuit formed under the device surface. The integrated circuit includes a large number of microelements known in the art.

The integrated circuit can be formed by use of a dry etching technique in which a resist pattern is formed on the device surface in the manner known in a art. To form the resist pattern on the device surface, a photo exposure device is often used.

In the manner which will presently be described, the photo exposure device comprises a light source and an optical system. The light source is for emitting an exposure light beam having a wavelength $\lambda$. The exposure light beam is incident on the device surface to have a focus margin M. The optical system has a numerical aperture NA. In the dry etching technique, the resist pattern has a practical resolution R. The practical resolution R and the focus margin M are represented by:

$$R = k \cdot \lambda / NA \quad (1)$$

and $$M = k' \cdot \lambda / (NA) \quad (2)$$

Herein, k and k' represent given constants between 0.5 and 1, both inclusive.

In a case where the resist pattern is made to have an extremely small part in size, the practical resolution R must have a small value. To this end, it is necessary to shorten the wavelength $\lambda$ and to increase the numerical aperture NA, as will be understood from Equation (1). With the increase of the numerical aperture NA, the focus margin M is drastically reduced, as is obvious from Equation (2). In this connection, it is required to make the device surface be substantially planarized.

In order to planarize the device surface, use has widely been made of a method of reflowing a BPSG (boron-doped phospho silicate glass) film as disclosed by Karn et al in Solid State Technology, June 1985, pp. 171–179. Alternatively, an etchback method is well known and disclosed, for example, in Nikkei Microdevice, June 1988, pp. 33–46. In these methods, it is possible to locally planarize the device surface, specifically, to exclusively planarize the protruded portions that are closely adjacent to one another. However, it is impossible to effectively remove a step portion which will be produced between presence and absence of each of the protruding portions and between presence and absence of a group of the protruding portions that are closely adjacent to one another.

In order to substantially planarize the device surface, attention has been recently directed to a polishing technique or operation known in the art. For example, a method of planarizing the device surface through the polishing operation is disclosed by R. R. Uttecht et al in Proc. 1991 VMIC Conference, pp. 20–26. The method will hereunder be called a first conventional method. In the manner which will later be discussed with reference to the drawings, the first conventional method not only has a lower efficiency but also suffers a technical difficulty.

Another method is disclosed in Japanese Patent Prepublication No. 295239/1991 and will hereunder be called a second conventional method. In the second conventional method, it is impossible to effectively remove the above-mentioned step portion in the manner which will later be discussed with reference to the drawings.

The present inventor developed a method which is described in Japanese Patent Application No. 94677/1992 which is not yet available to the public. The method will hereunder be called a third conventional method. According to the third conventional method, the polishing operation for planarization can be achieved with both high efficiency and high precision.

However, the third conventional method increases the number of the process steps inevitably raising the manufacturing cost. When the polishing operation is redundantly continued, the device surface is excessively polished or overpolished in the manner which will later be discussed with reference to the drawing.

SUMMARY OF THE INVENTION

It is an object of this invention to provide a method of giving to a semiconductor device with a device surface which is substantially planarized through a polishing operation with a reduced number of processes and which avoids occurrence of overpolishing thereof.

Other objects of this invention will become clear as the description proceeds.

According to this invention, there is provided a method of providing a semiconductor device with a substantially planarized device surface through a polishing operation. The semiconductor device comprises a semiconductor substrate portion having a substrate surface and a protruding portion protruding from the substrate surface. The method comprises the steps of coating the substrate surface and the protruding portion with a first anti-polishing film, depositing an insulator film on the first anti-polishing film, the insulator film having a first polishing rate for the polishing operation, coating the insulator film with a second anti-polishing film having a polishing rate lower than the first polishing rate for the polishing operation, and applying the polishing operation to the second anti-polishing film and to the insulator film to produce the device surface that is substantially planarized.

DESCRIPTION OF THE PREFERRED EMBODIMENTS

At first, description will be made as regards conventional methods with reference to the drawings for a better understanding of the present invention.

Figure 1:
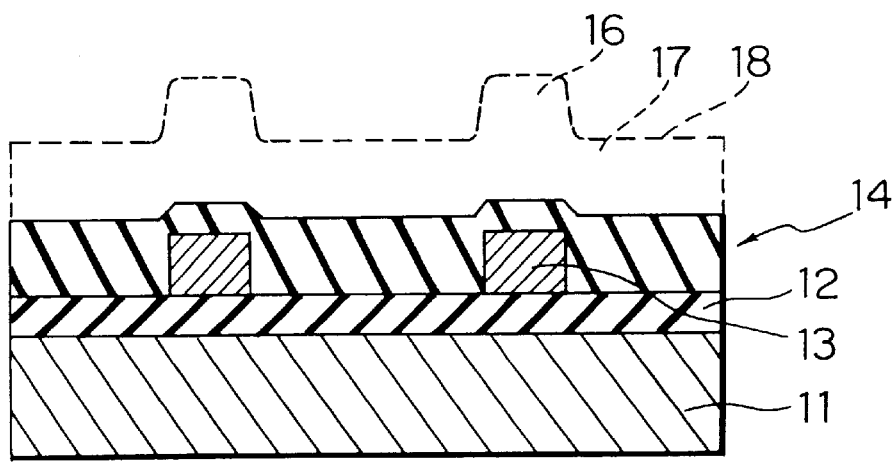
FIG. 1 is a schematic sectional view for describing a first conventional method for planarization.

Referring to FIG. 1 at first, the description will be directed to the first conventional method described in the preamble of the specification. A silicon substrate is depicted by a reference numeral 11. An underlying insulator film 12 is deposited on the silicon substrate 11. A plurality of metal wiring patterns such as 13 are formed as a protruding portion on the underlying insulator film 12. An interlayer insulator film 14 is formed on the underlying insulator film 12 and the wiring patterns 13. As illustrated by a dashed line in FIG. 1, the interlayer insulator film 14 has a relatively higher portion 16 and a relatively lower portion 17 corresponding to presence and absence of each of the wiring patterns 13, respectively.

The interlayer insulator film 14 has a film surface 18 polished by a polishing operation which uses a rotary polishing plate covered with a polishing pad in the manner which will be described in the following. During the polishing operation, the film surface 18 is brought into press contact with the polishing pad. In this event, a polishing pressure acts between the film surface 18 and the polishing pad. Generally, the polishing pressure is greater in the relatively higher portion 16 than in the relatively lower portion 17. Accordingly, the relatively higher portion 16 has a polishing rate which is higher than that of the relatively lower portion 17. With carrying out the polishing operation, the film surface 18 is gradually planarized as illustrated by a solid line in FIG. 1.

In the polishing operation, the polishing rate is reduced to approach that in the relatively lower portion if the relatively higher portion 16 has a large width. In other words, the relatively lower portion 17 is inevitably and substantially polished in order to remove the relatively higher portion 16 having the large width.

Under the circumstances, the interlayer insulator film 14 is deposited to have a thickness substantially (for example, twice through three times) greater than the height of each of the wiring patterns 13. However, the first conventional method not only has a lower efficiency but also suffers a technical difficulty that the interlayer insulator film 14 must be polished so as to leave a predetermined film thickness.

Figure 2:
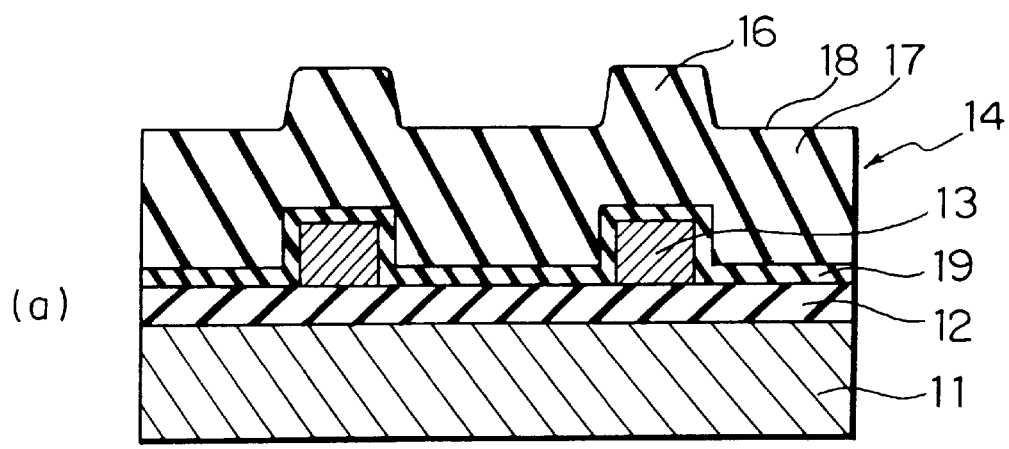
FIGS. 2(a) and (b) are schematic sectional views for describing a second conventional method for planarization using an anti-polishing film.
Figure 2:
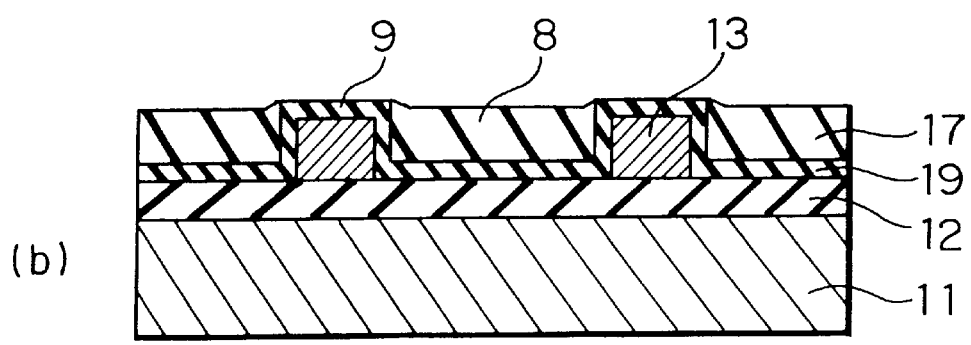

Turning to FIGS. 2(a) and (b), the description will be directed to the second conventional method described in the preamble of the specification. Similar parts are designated by like reference numerals.

The wiring patterns 13 are preliminarily coated with a polishing stopper layer 19 composed of an insulator material having a polishing rate which is lower than that of the interlayer insulator film 14. While the interlayer insulator film 14 is polished for planarization, the polishing rate is reduced at the time instant when the polishing stopper layer 19 is exposed.

Figure 3:
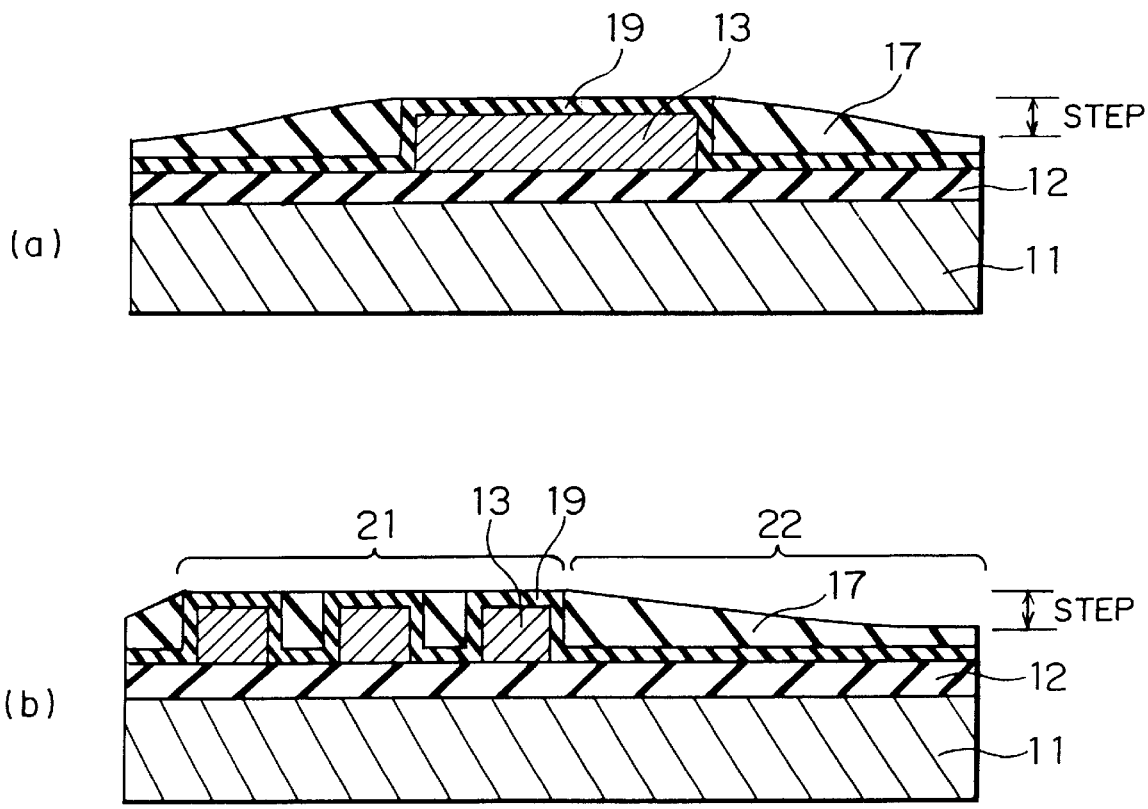
FIGS. 3(a) and (b) are schematic sectional views for describing a problem in the second conventional method for planarization illustrated in FIG. 2.

According to the second conventional method, it is readily possible to make the interlayer insulator film 14 have a resultant film thickness after it has been polished for planarization. However, it will be assumed that a step portion is formed, as illustrated in FIG. 3(a), between each of the wiring patterns 13 of a wide width and a surrounding portion 21 thereof or, as illustrated in FIG. 3(b), between a densely patterned area 21 including positive patterns closely adjacent one another and a peripheral area 22. In each case, it is still impossible to effectively remove the step portion.

Turning to FIGS. 4(a) to (d), the description will be directed to the third conventional method described in the preamble of the specification. Similar parts are designated by like reference numerals. It is to be noted that the relatively lower portion 17 of the interlayer insulator film 14 has a lower portion thickness.

Figure 4:
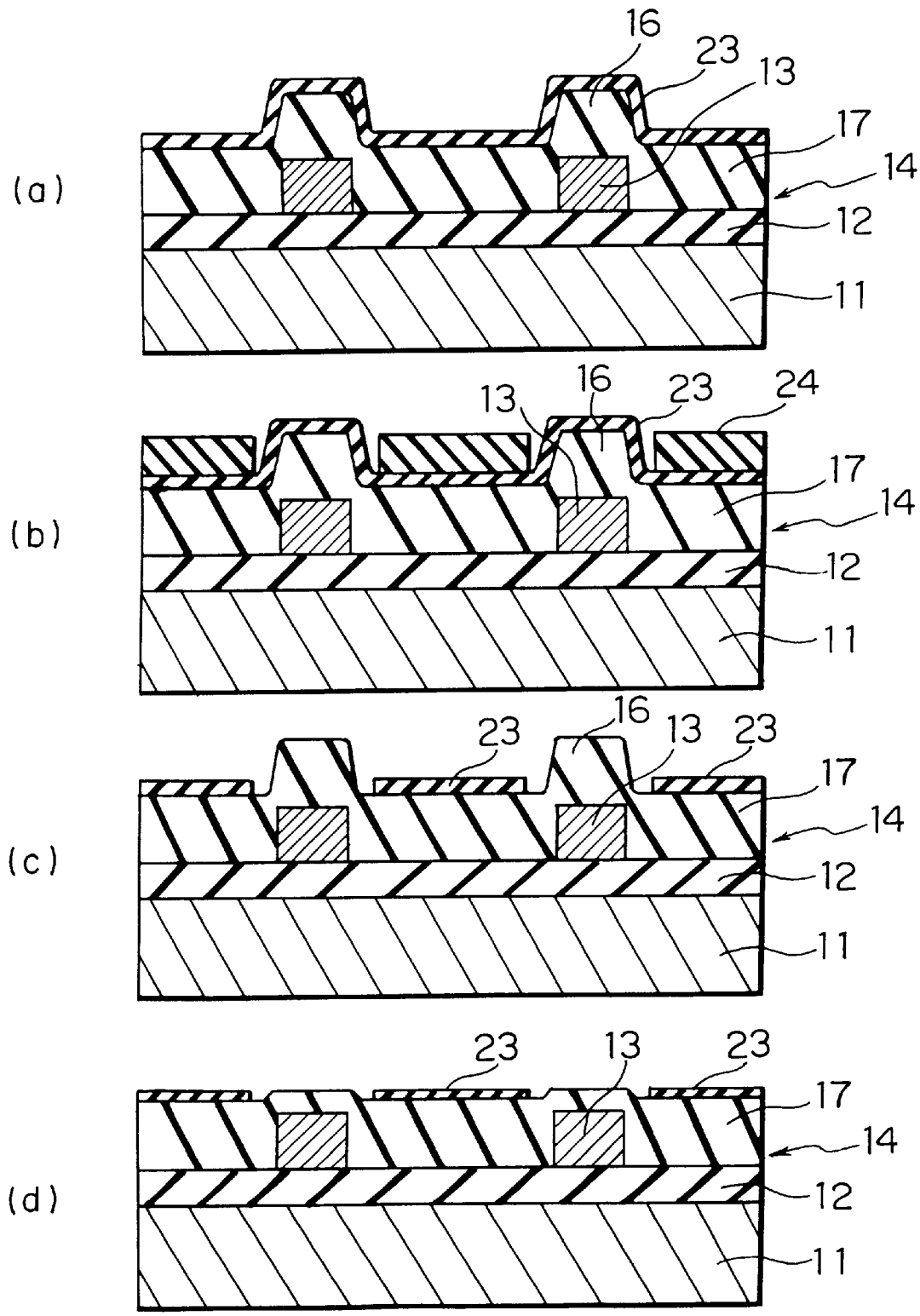
FIGS. 4(a) through (d) are schematic sectional views for describing a third conventional method for planarization using an anti-polishing film.

Referring to FIG. 4(a), the interlayer insulator film 14 is covered with the anti-polishing film 23 deposited thereon by a Chemical Vapor Deposition (CVD) method known in the art. The anti-polishing film 23 is made of silicon nitride. As illustrated in FIG. 4(b), photoresists such as 24 is selectively formed on the anti-polishing film 23 to correspond to the relatively lower portion 17 by the use of photolithography known in the art.

Then, dry etching is carried out with each of the photoresists 24 used as a mask to selectively remove the anti-polishing film 23. As a consequence, the interlayer insulator film 14 is exposed at the relatively higher portion 16 on one hand and covered by the anti-polishing film 23 at the relatively lower portion 17 on the other hand, as illustrated in FIG. 4(c). Then, the interlayer insulator film 14 is subjected to the polishing operation. In the polishing operation, the relatively higher portion 16 is selectively and efficiently removed to provide a planarized surface as illustrated in FIG. 4(d).

On the other hand, the relatively lower portion 17 is covered by the anti-polishing film 23 as described above. In this connection, the relatively lower portion 17 is never changed or reduced from the lower portion thickness even after the polishing operation is carried out. Accordingly, the third conventional method is excellent in controllability of the lower portion thickness of the interlayer insulator film 14 after it has been polished. Thus, the polishing operation can be achieved for planarization of the device surface with both high efficiency and high precision.

Figure 5:
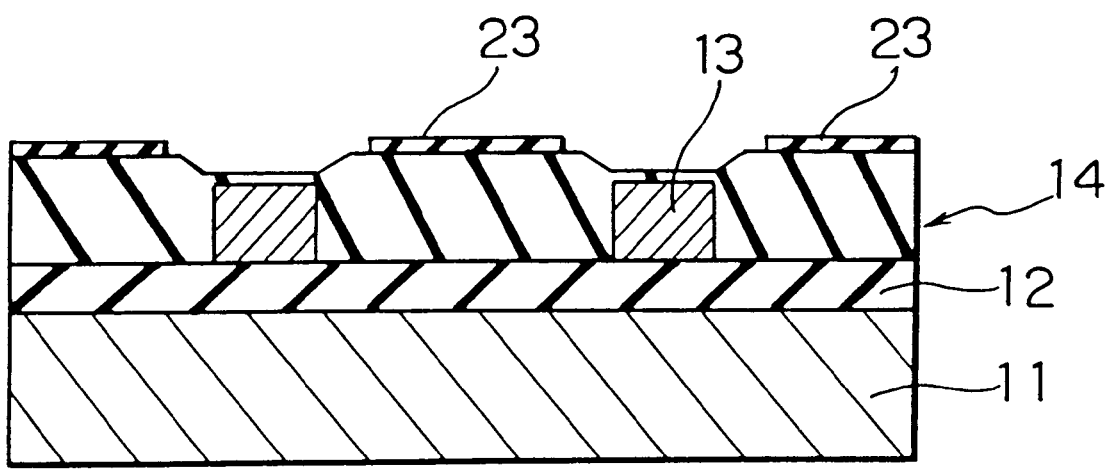
FIG. 5 is a schematic sectional view for describing a problem in the third conventional method for planarization illustrated in FIG. 4.

However, it is necessary in the third conventional method to use various processes such as a process of a photoresist mask for producing the photoresist, a process of photolithography, and a process of the dry etching. As a result, the third conventional method increases the number of the processes, inevitably to raise the manufacturing cost. In addition, when the polishing operation is redundantly continued for a long time after the relatively higher portion 16 is completely polished, the interlayer insulator film 14 is excessively polished or overpolished to be depressed to a level lower than that of the anti-polishing film 23, as illustrated in FIG. 5.

The description will now proceed to preferred embodiments of this invention with reference to the drawing.

Referring to FIGS. 6(a) to (d), the description will be made as regards a method according to a first embodiment of this invention. Similar parts are designated by like reference numerals.

Figure 6:
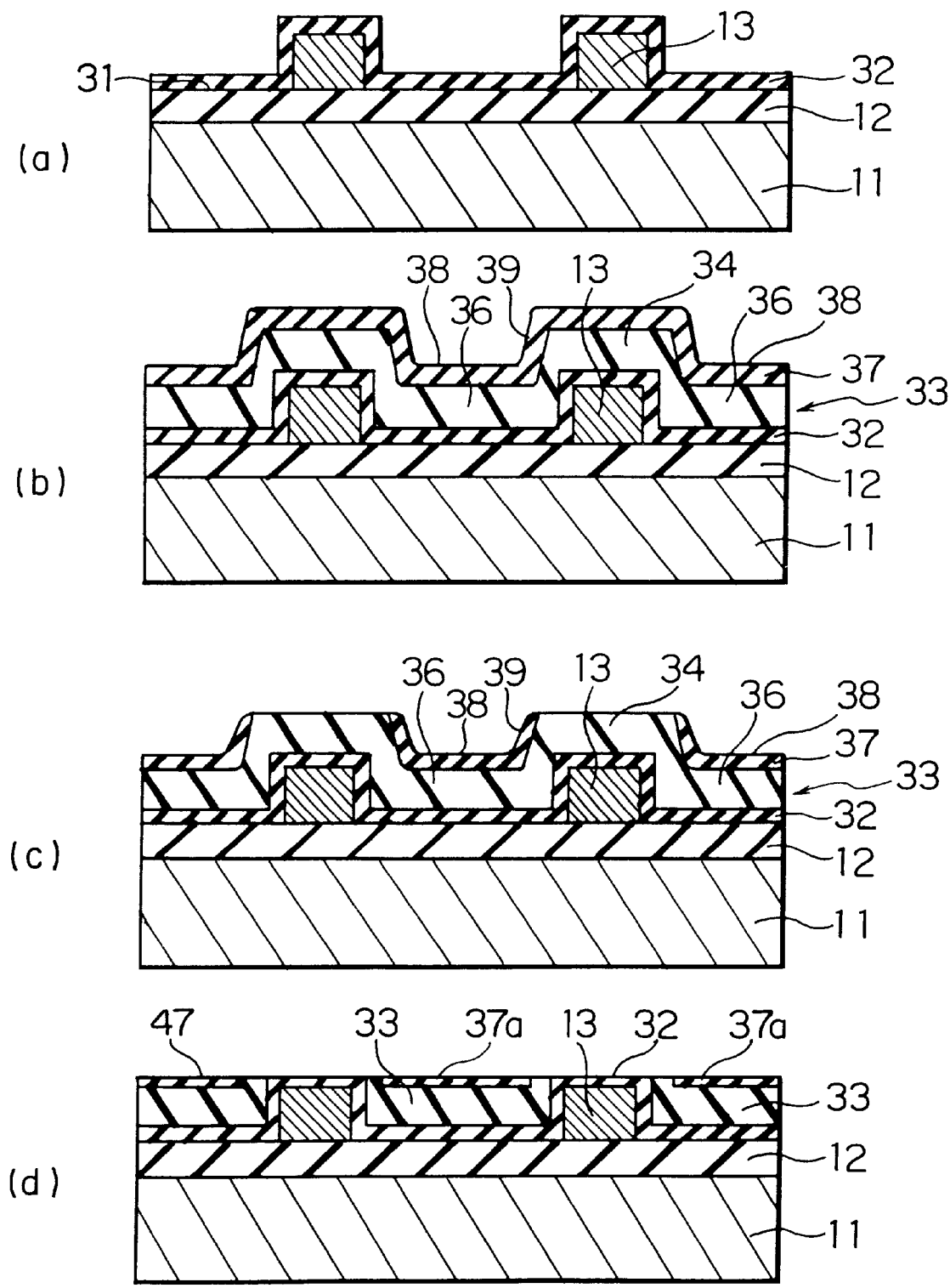
FIGS. 6(a) through (d) are schematic sectional views for describing a method according to a first embodiment of this invention.

Referring to FIG. 6(a) at first, the silicon substrate 11 is provided with various devices (not shown) such as transistors. The underlying insulator film 12 is deposited on the silicon substrate 11 by the CVD method and has a plurality of contact holes (not shown) in the manner known in the art. A combination of the silicon substrate 11 and the underlying insulator film 12 is referred to as a semiconductor substrate portion and has a substrate surface 31.

Each of the above-mentioned wiring patterns 13 is made of Al to have a thickness between 0.5 and 0.8 $\mu$m. The wiring patterns 13 are formed on the underlying insulator film 12 to protrude from the substrate surface 31 and therefore are referred to herein as a protruded portion.

After the wiring patterns 13 are formed on the underlying insulator film 12, a first anti-polishing film 32 is deposited to coat the substrate surface 31 and the wiring patterns 13 by the CVD method such as a plasma CVD method. The first anti-polishing film 32 is composed of silicon oxide to have a thickness between 0.1 and 0.2 $\mu$m.

Turning to FIG. 6(b), an interlayer insulator film 33 is deposited by the CVD method such as an atmospheric CVD method using a gas source of $O_3$-TEOS-TMP-TMB ($O_3$: ozone, TEOS: tetra ethoxy silane, TMP: triethyl phosphate, TMB: triethyl borate). The interlayer insulator film 33 is composed of boron-doped phospho-silicate glass (BPSG) to have a relatively higher portion 34 and a relatively lower portion 36 corresponding to the presence and the absence of each of the wiring patterns 13, respectively. Subsequently, a second anti-polishing film 37 is deposited by the plasma CVD method. The second anti-polishing film 37 is composed of silicon oxide or silicon nitride to have a thickness between 0.1 and 0.3 $\mu$m. Thus, a polishing object device is manufactured to have a flat surface portion 38 and a plurality of island portions such as 39 which is protruded from the flat surface portion 38.

The interlayer insulator film 33 has a first polishing rate for the polishing operation. Each of the first and the second anti-polishing films 32 and 37 has a polishing rate approximately three to five times slower than the first polishing rate for the polishing operation.

Figure 7:
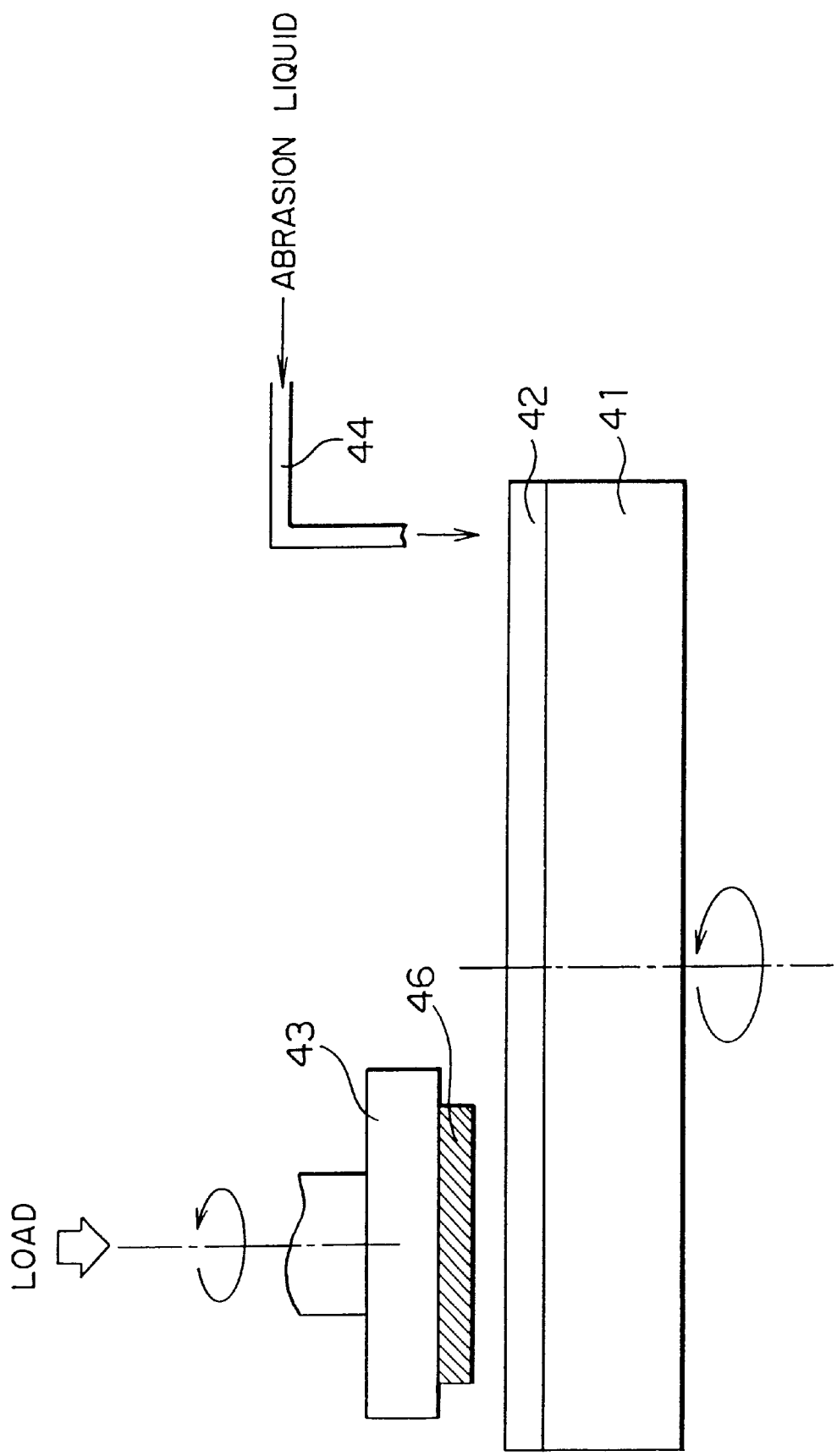
FIG. 7 is a schematic diagram of a polishing device.

Referring shortly to FIG. 7 in addition, the description is made as regards a polishing apparatus which can be used to carry out the polishing operation. In the manner which will be described in the following, the polishing apparatus comprises a rotary polishing plate 41 having an upper surface, an abrasive cloth or pad 42 covering the upper surface, a quartz chuck 43 opposite to the abrasive cloth 42 with a space left therebetween, and a supplying tube 44. The device to be polished is depicted at a numeral 46.

In order to carry out the polishing operation, the device to be polished is held by the quartz chuck 43 with the second anti-polishing film 37 being opposite to the abrasive cloth 42. The device is rotated and brought into press contact against the abrasive cloth 42. As a result, the island portion 39 is subjected to polishing with the rotary polishing plate 41 rotated. In this event, an abrasion liquid is supplied to the abrasive cloth 42 through the supplying tube 44. As the abrasion liquid, use is made of a slurry formed by dispersing colloidal silica having a particle size substantially equal to 0.01–0.1 $\mu$m in alkali solution of pH 7.5 through 11.

Turning to FIG. 6(c), the second anti-polishing film 37 is polished at the island portion 39 by the polishing operation. In a case where each of the wiring patterns 13 has a width of 1 $\mu$m, the island portion 39 is polished at a polishing rate approximately twenty times as high as that in the flat surface portion. In another case where each of the wiring patterns 13 has a width substantially equal to 100 $\mu$m, the polishing rate is within a range between twice through five times as high. Accordingly, the second anti-polishing film 37 is selectively removed from the island portion 39 to expose a part of the interlayer insulator film 33 as a specific are while the second anti-polishing film 37 is left at the flat surface portion 38 as illustrated in FIG. 6(d).

In the meanwhile, it is to be noted that the interlayer insulator film 33 has the first polishing rate approximately three times greater than the second polishing rate. Accordingly, after the second anti-polishing film 37 is removed, the interlayer insulator film 33 is selectively polished to be reduced in height. At the same time, the second anti-polishing film 37 is slightly polished to have an undeleted area 37a which remains on the flat surface portion 38 as will become clear from FIG. 6(d).

If the second anti-polishing film 37 has an initial thickness properly selected, the second anti-polishing film 37 is left on the flat surface portion 38 until the interlayer insulator film 33 is completely removed at the island portion 39. Simultaneously when the interlayer insulator film 6 is completely removed at the island portion 39, the first anti-polishing film 32 is partially exposed. Accordingly, the polishing rate is automatically reduced. Thus, a semiconductor device is manufactured to have a device surface 47 which is substantially planarized as will become clear from FIG. 6(d). It is to be noted here that the device surface 47 comprises the first anti-polishing film 32, the interlayer insulator film 6, and the undeleted area 37a of the second anti-polishing film 37.

Another silicon oxide film may be deposited on the device surface 47. By repeating formation of contact holes and wiring patterns, deposition of another interlayer insulator film, and planarization of the interlayer insulator film, a multilayer wiring structure can be obtained. As a material of each wiring pattern, use may be made of Al—Ge, Al—Cu—Si, polysilicon, silicide, Cu, and the like.

Turning to FIGS. 8(a) to (d), the description will be directed to a method according to a second embodiment of this invention. Similar parts are designated by like reference numerals. The description will be made as regards a case where the method is applied to a memory device such as a dynamic random access memory (DRAM) as the semiconductor device.

Figure 8:
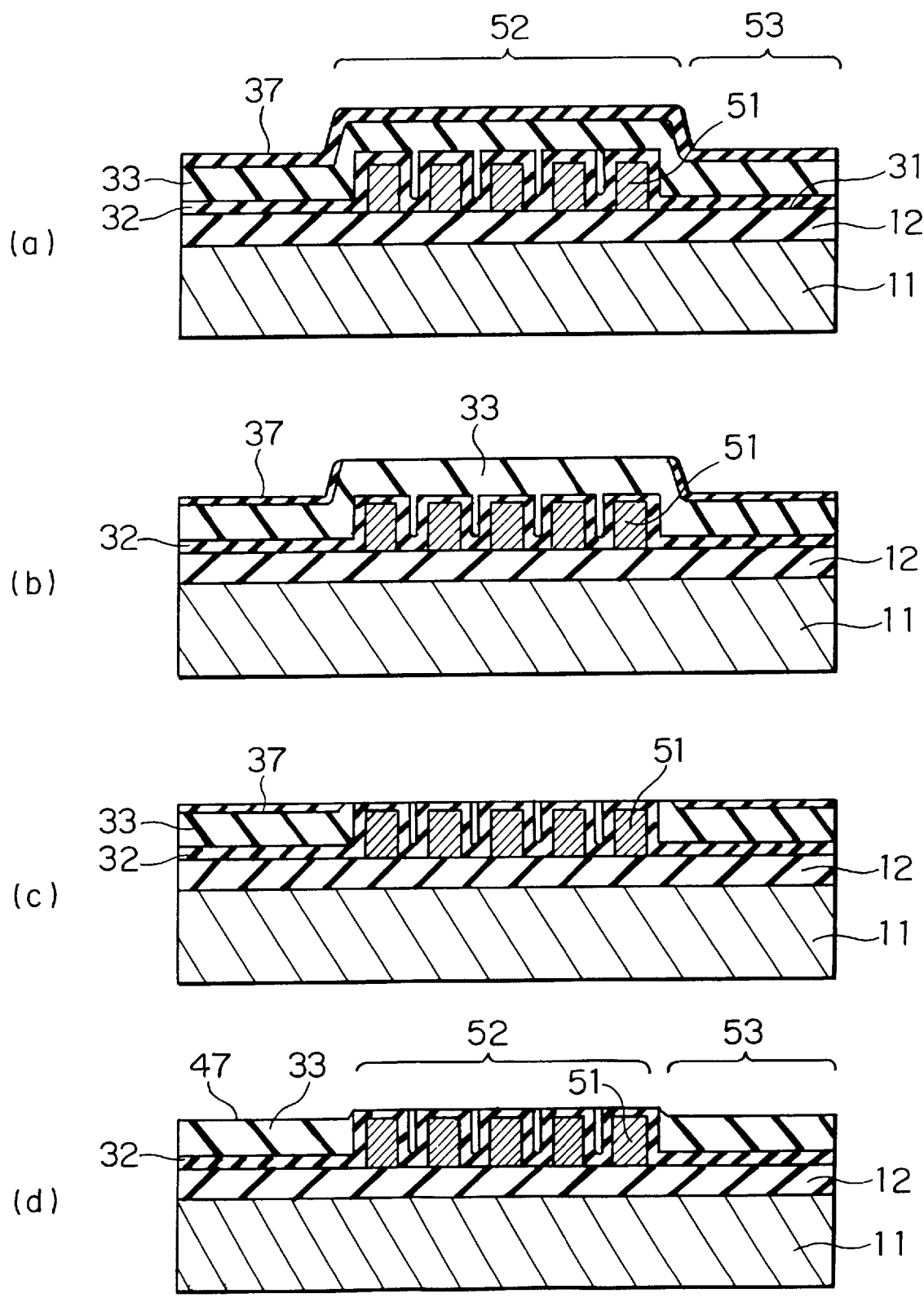
FIGS. 8(a) through (d) are schematic sectional views for describing a method according to a second embodiment of this invention.

Referring to FIG. 8(a) at first, the silicon substrate 11 has transistors for peripheral circuits such as transfer gates and decoders, and a polysilicon or silicide wiring layer including word lines and bit lines, although not shown in the figure. The underlying insulator film 12 is formed on the silicon substrate 11 to have the contact holes (not shown). On the underlying insulator film 12, a polysilicon stack capacitor 51 is formed as the protruded portion to have an array of memory cells. After a capacitor plate electrode (not shown) is formed, a first anti-polishing film 32 of silicon oxide is deposited by the CVD method. A combination of the silicon substrate 11 and the underlying insulator film 12 is referred to as a semiconductor substrate portion.

Furthermore, the interlayer insulator film 33 of BPSG is formed by the atmospheric CVD method. Thereafter, the interlayer insulator film 33 is subjected to a reflowing process at a temperature between 800° C. and 900° C. for planarization of a local unevenness on the surface of the interlayer insulator film 33. As a consequence, the surface of the interlayer insulator film 33 is planarized independently in a memory cell array area 52 and in a peripheral circuit area 53. However, the interlayer insulator film 33 is protruded to a higher level in the memory cell array area 52 than in the peripheral circuit area 53. This results in the presence of a step portion at a boundary between the memory cell array area 52 and the peripheral circuit area 53. The step portion has a step height. The interlayer insulator film 33 has a second predetermined polishing rate for the polishing operation.

On the interlayer insulator film 33, a second anti-polishing film 37 of silicon nitride is deposited by the CVD method. The first anti-polishing film 32 has a first polishing rate for the polishing operation. The second anti-polishing film 37 has a second polishing rate for the polishing operation. The first polishing rate is slower than the second polishing rate. The second polishing rate is approximately five times as high as the second polishing rate.

Referring to FIG. 8(b), the polishing operation is carried out by the use of a slurry as the abrasion fluid. The slurry is prepared by dispersing colloidal silica in an alkali aqueous solution. At first, the second anti-polishing film 37 is selectively removed from the memory cell array area 52 to expose the interlayer insulator film 33 because those films are protruded to a high level in the memory cell array area 52 than in the peripheral circuit area 53. It is essential here that the second anti-polishing film 37 is left on the interlayer insulator film 33 in the peripheral circuit area 53.

With a further progress of the polishing operation, the interlayer insulator film 33 is selectively removed in the memory cell array area 52 to reduce the step height of the step portion that is between the memory cell array area 52 and the peripheral circuit area 53. Since the interlayer insulator film 33 is still covered in the peripheral circuit area 53 by the second anti-polishing film 37, the thickness of the interlayer insulator film 33 is unchanged at that portion.

The polishing operation is still further continued until the step portion is completely removed as illustrated in FIG. 8(c). When the step portion is completely removed, the first anti-polishing film 32 is exposed as the specific area having a polishing rate slower than the second polishing rate. Accordingly, a polishing speed is automatically reduced as a whole. In this state, the polishing operation is finished.

Turning to FIG. 8(d), the second anti-polishing film 37 is selectively etched by the use of hot phosphoric acid in the manner known in the art. As a consequence, the device surface 47 is obtained throughout the memory cell array area 52 and the peripheral circuit area 53. It is to be noted here that the device surface 47 comprises the interlayer insulator film 33 and the first anti-polishing film 32.

If necessary, another silicon oxide film is further deposited by the CVD method. In addition, contact holes and Al wiring patterns may be formed. In the method, the second anti-polishing film 37 is removed by the use of hot phosphoric acid in the manner known in the art.

It is readily understood that the second anti-polishing film 37 can be removed by dry etching or further polishing. The second anti-polishing film 37 may be a silicon oxide film having a polishing rate which is slower than that of the interlayer insulator film 33.

The polysilicon stack capacitor 51 exemplified may be replaced by a bus line array including a large number of Al wiring patterns extending in parallel at a narrow pitch. Therefore, it is also applicable to planarization of the interlayer insulator film 33 that is locally protruded to a higher level in a bus line array area than in a peripheral area. In this case, the reflowing process is deleted from a series of processes described above.

Turning to FIGS. 9(a) to (g), the description will be directed to a method according to a third embodiment of this invention. The method is applied to trench isolation of transistors or the silicon substrate or a Silicon-On-Insulator (SOI) substrate known in the art. In the manner illustrated in FIG. 9(a), the SOI substrate comprises a silicon substrate 61, a silicon oxide layer 62 on the silicon substrate 61, and a silicon layer 63 on the silicon oxide layer 62. The silicon layer 63 is made of thin-film single crystal to have a thickness between 0.5 $\mu$m and 5 $\mu$m. A combination of the silicon substrate 61 and the silicon oxide layer 62 is referred to as a semiconductor substrate portion having a substrate surface 64.

Figure 9:
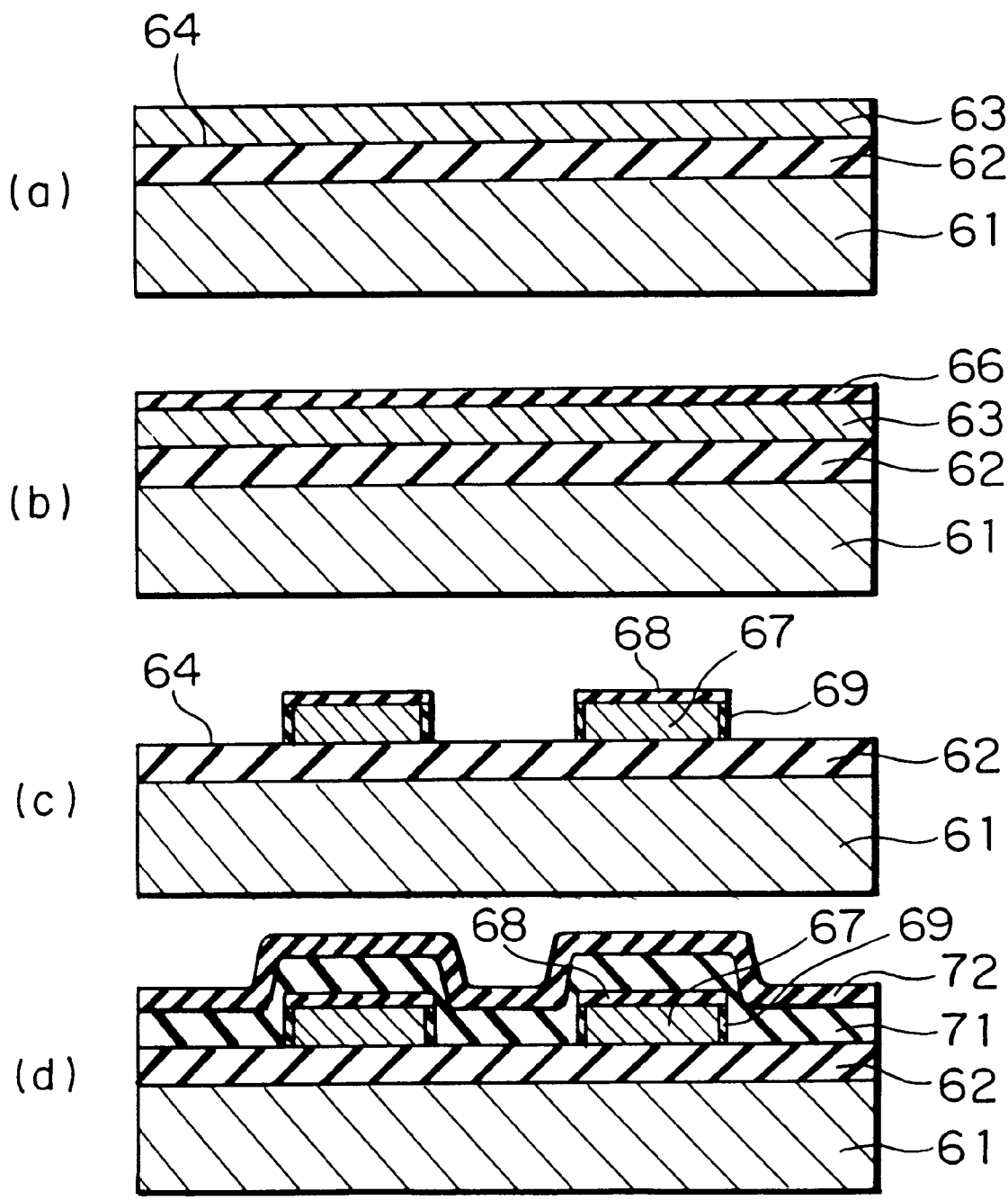
FIGS. 9(a) through (g) are schematic sectional views for describing a method according to a third embodiment of this invention.
Figure 9:
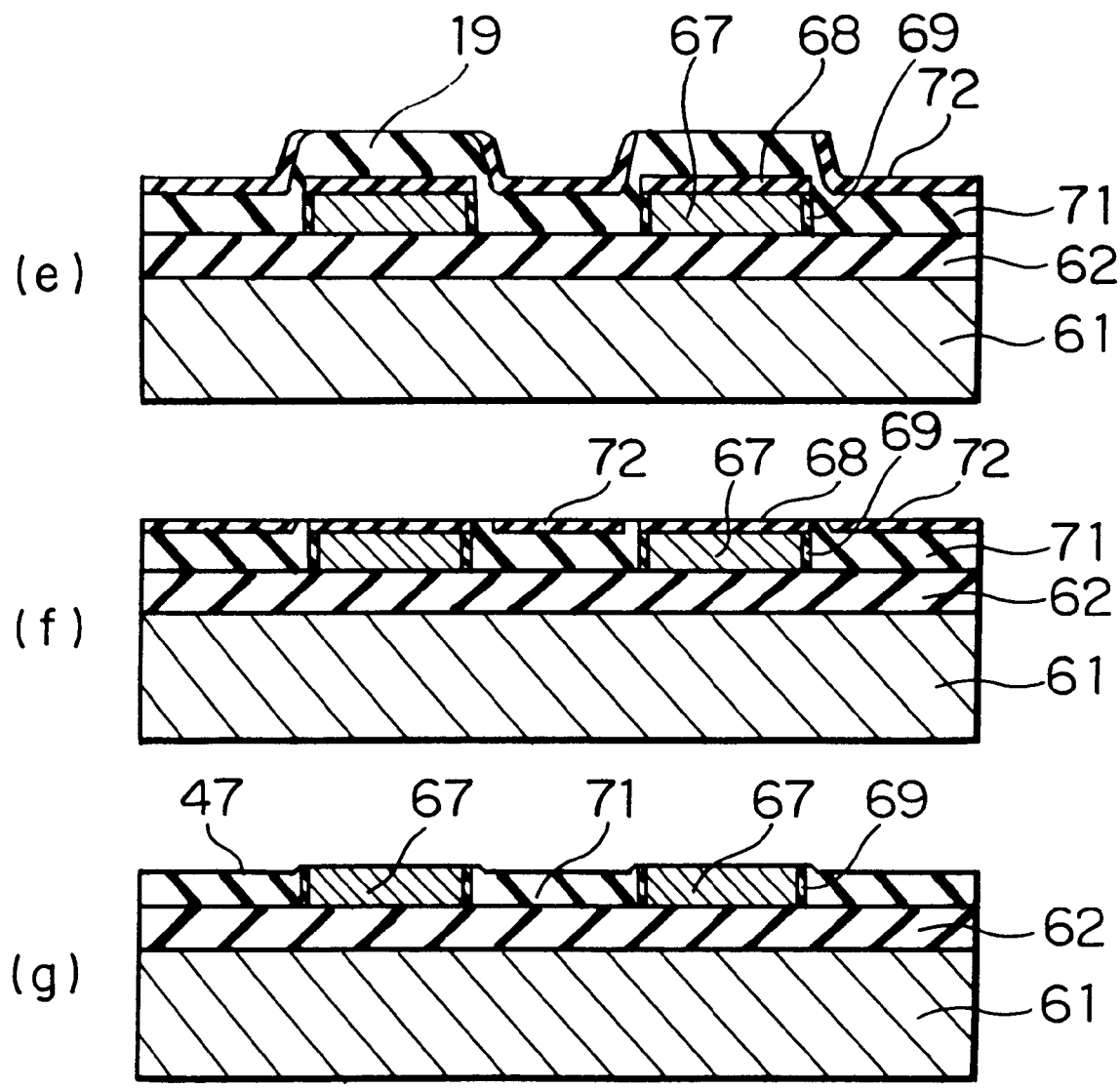

After the silicon layer 63 has an upper surface which is oxidized, a silicon nitride film 66 is formed on the upper surface of the silicon layer 63 as illustrated in FIG. 9(b). The silicon nitride film 66 has a thickness substantially equal to 0.1 $\mu$m.

Next, the SOI substrate is subjected to photolithography and dry etching so that the silicon layer 63 and the silicon nitride film 66 are partially deleted to form a protruded portion 67 having an upper surface or a principal surface covered with a first anti-polishing film 68 as illustrated in FIG. 9(c). The substrate surface 64 and the principal surface have a distance left therebetween. In addition, a thermal oxidation film 69 is formed on each side surface of the protruded portion 67 with the first anti-polishing film 68 used as a mask for the photolithography.

Turning to FIG. 9(d), an isolation film 71 and a second anti-polishing film 72 are successively deposited by the CVD method. The isolation film 71 is made of silicon oxide. It is to be noted here that the isolation film 71 has a thickness similar to or slightly greater than that of the protruded portion 67. The isolation film 71 is referred to as an insulator film. The isolation film 71 has a third polishing rate for the polishing operation. Each of the first and the second anti-polishing films 68 and 72 has a polishing rate approximately three times slower than the third polishing rate for the polishing operation.

Then, the SOI substrate is polished in the manner described in the foregoing description. The second anti-polishing film 72 is at first removed in a selected film area corresponding to the presence of the protruded portion 67 to expose the isolation film 71 as illustrated in FIG. 9(e). It is essential here that the second anti-polishing film 72 is left on the isolation film 71 in a flat area having no protruded portion 67.

With a further progress of the polishing operation, the isolation film 71 is selectively deleted from the protruded portion 67 until it is completely removed as illustrated in FIG. 9(f). The third polishing rate of the isolation film 71 of silicon oxide is approximately twice through three times greater than the polishing rate of the second anti-polishing film 72 of silicon nitride.

Simultaneously when the isolation film 71 is completely removed from the selected film area, the first anti-polishing film 68 is exposed to automatically reduce the polishing rate. Thereafter, the first and the second anti-polishing films 68 and 72 are removed by the use of hot phosphoric acid in the manner known in the art.

Thus, the device surface 47 of the semiconductor device is substantially planarized as illustrated in FIG. 9(g). In the semiconductor device, the protruded portion 67 is buried in the isolation film 71.

Turning to FIGS. 10(a) to (f), the description will be directed to a method according to a fourth embodiment of this invention. The method is applied to trench isolation structure which is for isolating transistors from one another in the manner known in the art.

Figure 10:
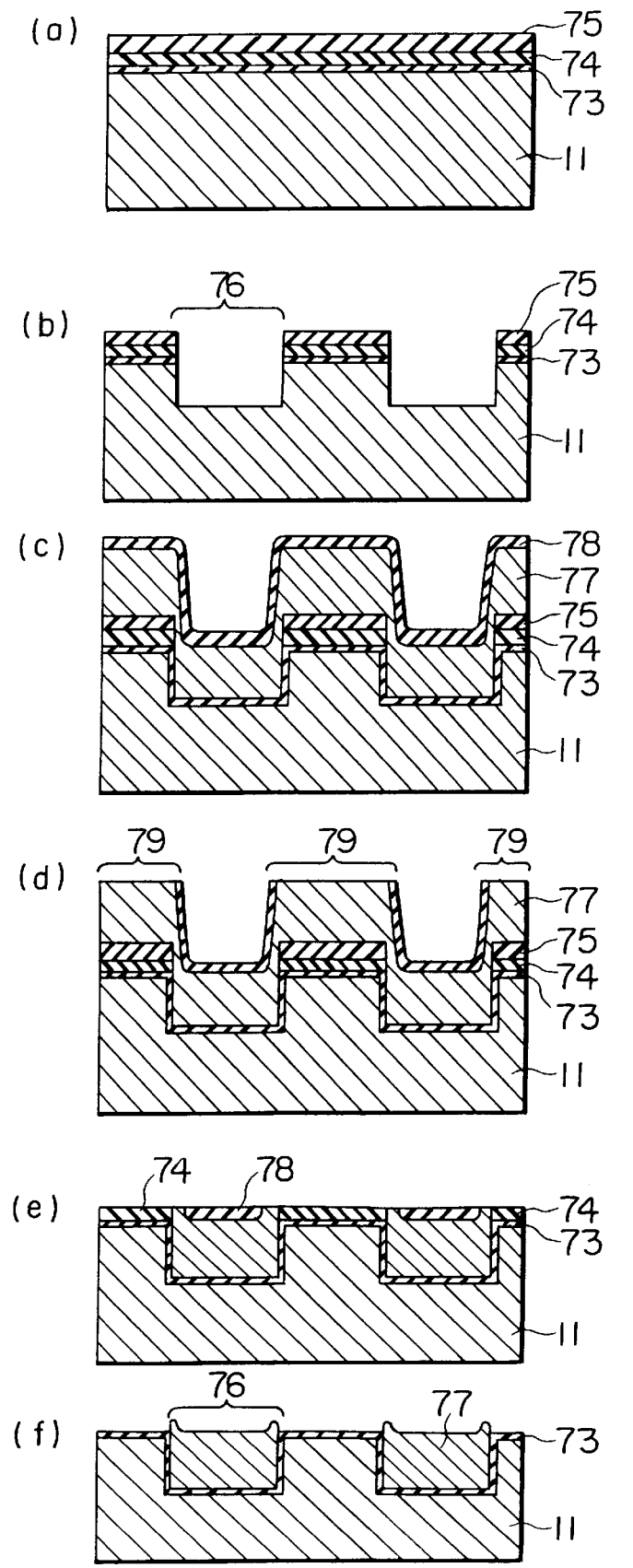
FIGS. 10(a) through (f) are schematic sectional views for describing a method according to a fourth embodiment of this invention.

Referring to FIG. 10(a) at first, a thermal oxidation film 73 is formed on the silicon substrate 11 to have a thickness between 100 and 200 angstroms. On the thermal oxidation film 73, a silicon nitride film 74 is deposited as the first anti-polishing film by the CVD method to have a thickness substantially equal to 1000 angstroms. On the silicon nitride film 74, a silicon oxidation film 75 is deposited to have a thickness substantially between 2000 and 5000 angstroms. In the manner which will become clear from the following, the silicon oxidation film 75 is used to form an etching mask known in the art.

Next, the silicon nitride and the silicon oxidation films 74 and 75 are partially deleted by the dry etching with using a resist mask known in the art. The silicon oxidation film 75 has a remaining portion which serves as the etching mask. In addition, the silicon substrate 11 and the thermal oxidation film 73 are partially etched with using the etching mask. As a result, grooves such as 76 are formed as illustrated in FIG. 10(b).

Turning to FIG. 10(c), an additional thermal oxidation film is formed on an inner surface of the groove 76. After the additional thermal oxidation film is formed, an additional silicon oxidation film 77 is deposited by the CVD method. Herein, the additional silicon oxidation film 77 has a thickness equal to a depth of the groove 76 or slightly greater than that. It is p referable that the thickness of the additional silicon oxidation film 77 is substantially between 1000 and 2000 angstroms. Thereafter, an additional silicon nitride film 78 is deposited as the second anti-polishing film by the CVD method to have a thickness substantially between 1000 and 2000 angstroms.

The polishing operation is carried out with using, as the abrasion liquid, the slurry that is formed by dispersing the colloidal silica. As a result of the polishing operation, the additional silicon nitride film 78 is partially deleted as will become clear from projection areas or portions designated at reference numerals 79 in FIG. 10(d). By successively applying the polishing operation, the projection areas or portions 79 are deleted as will become clear from FIG. 10(e).

The first mentioned and the additional silicon nitride films 74 and 78 are perfectly deleted by boiling in the phosphoric acid. As a result, the trench isolation structure is produced as illustrated in FIG. 10(f). In the trench isolation structure, it is to be noted that the additional silicon oxidation film 77 is separated to a plurality of portions which are placed in the groove 76 of the silicon substrate 11 and are isolated from one another by the silicon substrate 11.

Although this invention has been described in conjunction with several preferred embodiments thereof, it will readily be understood for those skilled in the art to put this invention into practice in various other manners. As each of the first and the second anti-polishing films, use can be made of any other appropriate material which has a polishing rate slower than that of the interlayer insulator film. For example, a selected one of an insulator material such as silicon nitride, aluminum nitride, and aluminum oxide may be used to compose each of the first and the second anti-polishing films. In addition, each of the first and the second anti-polishing films can be deposited by the use of a sputtering method known in the art. As the interlayer insulator film, use can be made of any other insulator material having a polishing rate which is higher than that of each of the first and the second anti-polishing films. For example, the interlayer insulator film may be a selected one of a phosphosilicate glass (PSG) film deposited by the CVD method, a spin-on glass (SOG) film applied by a spin coating method known in the art, and the like. Various additives such as arsenic, phosphorus, and boron may be added to the spin-on glass film.

What is claimed is:

1. A method of manufacturing a semiconductor device with a device surface which is substantially planarized through a polishing operation, said semiconductor device comprising a semiconductor substrate portion having a substrate surface and a plurality of protruding portions protruding from said substrate surface, respectively, and arranged to keep a selected distance therebetween, said method comprising the steps of:

coating said substrate surface and said plurality of protruding portions with a first anti-polishing film;

depositing an insulator film on said first anti-polishing film, followed by subjecting said semiconductor device to a reflowing process for planarization of a local unevenness on a surface of said insulator film;

coating said insulator film with a second anti-polishing film;

applying said polishing operation to said second anti-polishing film and to said insulator film to produce said device surface that is substantially planarized; and deleting said second anti-polishing film by applying boiling phosphoric acid.

2. A method as claimed in claim 1, wherein said semiconductor device comprises a memory device having a memory cell array area and a peripheral circuit area, said plurality of protruding portions being formed in said memory cell array area.

3. A method as claimed in claim 1, wherein a surface of said insulator film located over said plurality of protruding portions is planarized in the reflow process, said planarized surface of said insulator film located over said plurality of protruding portions being coated with said second anti-polishing film.

* * * * *